(12) United States Patent
Matheson

(10) Patent No.: US 9,679,675 B2
(45) Date of Patent: *Jun. 13, 2017

(54) MANUFACTURING AND APPLICATIONS OF METAL POWDERS AND ALLOYS

(71) Applicant: Boston Electronic Materials, LLC, Belmont, MA (US)

(72) Inventor: Andrew Matheson, Belmont, MA (US)

(73) Assignee: Boston Electronic Materials LLC, Belmont, MA (US)

( * ) Notice: Subject to any disclaimer, the term of this patent is extended or adjusted under 35 U.S.C. 154(b) by 566 days.

This patent is subject to a terminal disclaimer.

(21) Appl. No.: 14/078,871

(22) Filed: Nov. 13, 2013

(65) Prior Publication Data

US 2014/0061549 A1    Mar. 6, 2014

Related U.S. Application Data

(63) Continuation of application No. PCT/US2012/037726, filed on May 14, 2012.

(60) Provisional application No. 61/486,419, filed on May 16, 2011.

(51) Int. Cl.
| | |
|---|---|
| *C23C 14/34* | (2006.01) |
| *H01B 5/00* | (2006.01) |
| *B22F 9/20* | (2006.01) |
| *B22F 9/24* | (2006.01) |
| *H01B 13/30* | (2006.01) |

(52) U.S. Cl.
CPC .............. *H01B 5/00* (2013.01); *B22F 9/20* (2013.01); *B22F 9/24* (2013.01); *C23C 14/3414* (2013.01); *H01B 13/30* (2013.01)

(58) Field of Classification Search
CPC .............................. B22F 9/24; C23C 14/3414

USPC ............................................................ 75/331
See application file for complete search history.

(56) References Cited

U.S. PATENT DOCUMENTS

| | | | | |
|---|---|---|---|---|
| 5,259,862 | A | * 11/1993 | White | C22B 34/10 75/363 |
| 5,958,106 | A | 9/1999 | Armstrong et al. | |
| 6,786,951 | B2 | * 9/2004 | He | B22F 9/24 75/365 |
| 7,455,713 | B1 | * 11/2008 | Halalay | B22F 9/24 422/127 |
| 8,673,051 | B2 | * 3/2014 | Matheson | B22F 1/02 75/228 |
| 2006/0230878 | A1 | 10/2006 | Anderson et al. | |
| 2008/0254293 | A1 | 10/2008 | Loffelholz et al. | |
| 2008/0295645 | A1 | 12/2008 | Halalay et al. | |
| 2014/0199202 | A1 | * 7/2014 | Matheson | B22F 1/02 419/30 |

FOREIGN PATENT DOCUMENTS

WO      2011009014 A2    1/2011

OTHER PUBLICATIONS

International Search Report and Written Opinion dated Nov. 7, 2012 in corresponding PCT/US2012/037726.
CN Office Action from Appln. No. 201280023622.5 dated Nov. 3, 2015.

* cited by examiner

*Primary Examiner* — Jie Yang

(57) ABSTRACT

Disclosed is a process to reduce mixtures of at least one metal halide by molten metal reduction of the liquid phase metal halide in an alkali or alkaline earth metal to form a reaction product comprising at least one metal mixture and a halide salt coating, in which the at least one metal halide is in stoichiometric excess to the molten metal reductant and wherein the reductant is consumed in the reaction and does not need to be removed at the end of the reaction.

5 Claims, No Drawings

MANUFACTURING AND APPLICATIONS OF METAL POWDERS AND ALLOYS

CROSS-REFERENCE TO RELATED APPLICATIONS

This application is a continuation of commonly owned copending PCT Application Ser. No. PCT/US2012/037726, filed May 14, 2012. The PCT Application claims priority from commonly owned, U.S. Provisional Patent Application Ser. No. 61/486,419, filed May 16, 2011. The disclosures of these applications are hereby incorporated herein by reference.

FIELD OF THE INVENTION

This invention relates to the production of metal powders and to applications of these metal powders.

BACKGROUND OF THE INVENTION

Metal powders possess utility in many applications. However, the ability to exploit these powders can be limited when their surfaces are coated in oxide films (and when other gases are present at the particle surface or within the body of the particles). In particular, applications making use of metal powders can be limited because of the oxygen content present in the powders and its influence upon metal sintering and other characteristics.

SUMMARY OF THE INVENTION

In this invention, a method of manufacture for metal powders is described that uses liquid phase reduction of a metal halide, or a mixture of metal halides, to produce a metal particle, coated in salts produced as a reaction byproduct. The reaction conditions can be chosen to select a range of metal particle sizes, and the salt coating prevents oxidation (or reaction with other atmospheric gases) and permits a range of applications hitherto difficult to achieve using metal powders. In particular, the process is designed to operate at low temperatures and thereby to maximize the surface area of the produced metal powders, accomplished by arranging the metal halide or halides to be in stoichiometric excess to the reductant. In this manner, the reaction terminates with no remaining reductant to contaminate the reaction products.

In the text below, it is to be understood that "metal" means at least one and potentially more than one metal element, and that "metal halide" means at least one and potentially more than one distinct metal halide. Furthermore, "reductant" means the reducing medium in which the metal halides are reduced to metal powders.

The invention relates to the production of metal powders and to their applications in a range of uses, for which the production process is particularly well-suited and also economically advantageous.

One preferred process of the present invention comprises the steps of:
(a) introducing the reductant as a liquid or a vapor into a reactor vessel containing the liquid metal halide or halides. The reductant is preferentially an alkali or alkaline earth metal, more preferentially an alkali metal, and most preferentially sodium metal, such that the reductant is always in stoichiometric deficiency to the metal halide or halides;

(b) separating the reaction product (a mixture of the metal and the reductant halide or halides) from the reactor vessel.

The metal thus produced is in the form of a metal powder encapsulated in a salt or salts. Depending on the application in mind, the metal powder can be separated from the salt/salts, or else can be further processed while encapsulated in the salt/salts.

One embodiment of the present invention is a process to reduce mixtures of at least one metal halide by molten metal reduction of the liquid phase metal halide in an alkali or alkaline earth metal, in which the at least one metal halide is in stoichiometric excess to the molten metal reductant. In certain preferred embodiments, the at least one metal halide mixture is a mixture of metal chlorides and the reductant is metallic sodium. In certain embodiments, the molten metal reductant is NaK.

In certain embodiments, the reaction product of the process comprises at least one metal mixture, a salt coating, and at most 5% metallic sodium. In certain embodiments, the reaction product comprises at least one metal mixture, a salt coating, and at most 1% metallic sodium.

In certain embodiments, the reaction products of the present invention may be used to form powder metallurgical components. In certain embodiments, the reaction products of the present invention may be used to form an anode. In certain embodiments, the reaction products of the present invention may be used to form a capacitor. In certain embodiments, the reaction products of the present invention may be used to form a metal sheet, coating or wafer. In certain embodiments, the reaction products of the present invention may be used to form a sputtering target. In certain embodiments, the reaction products of the present invention may be used to form a porous metal element.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

DETAILED DESCRIPTION OF THE INVENTION

As described above, liquid metal reductants can be injected as liquids into a stoichiometric excess of molten metal halide, and therein reduce the metal halide to metal, as a particle coated in reductant halide. The typical size of the metal particle is a function of the temperature of the reaction, the flow rates of the reagents, and the diffusion characteristics of the metal. By careful control of the reaction conditions, one can select for a range of typical metal particle sizes. The surface area of the metal is related to the particle size, and the surface area of the metal particle determines many important physical characteristics of the metal in commercial applications.

The elemental composition of the metal particle can be chosen by selecting the ratio of metal halides and mixing them prior to injection into the reductant. Wide ranges of metal alloys can be produced in this manner.

The reaction produces a metal powder coated in a halide salt, with excess metal halide present. The metal halide can be removed by sublimation or other means and the reaction product can be removed from the reactor for further processing.

The particle size produced by this process is controlled by a number of factors, including the reaction temperature, the flow rates of the reagents, and the specific metal or metals being processed. The ability to select particle size is an important and attractive aspect of the present invention. Particle sizes are summarized in the following table:

|  | Reaction temperature, degrees Celsius | | |
| --- | --- | --- | --- |
|  | 275 | 550 | 775 |
| Primary particle size, nm | 10-50 | 20-100 | 50-500 |
| Aggregate size, microns | 0.2-1 | 0.4-5 | 0.6-25 |

An important advantage of operating at a stoichiometric excess of metal halide is that the reductant is consumed in the reaction and does not need to be removed at the end of the reaction. Since removal or excess reductant can most efficiently be accomplished by heating the reaction products to evaporate excess reductant, and since heat can cause the produced metal powder to lose surface area, the advantage of operating with an excess of metal halide includes maximizing the surface area of the produced metal powder.

The metal produced by this methodology is well suited to the production of powder metallurgical parts, components and devices, because it can be sintered to form a solid part without inclusion of oxygen, nitrogen or other gases, all of which can have deleterious effects on the metallurgical properties of metallurgical parts, components and objects formed through powder metallurgical techniques. Processing is possible either with the salt coating in place, or after removing the salt coating in such a manner as to avoid exposing the metal powder to deleterious gaseous contamination, or by removing the salt coating with a suitable solvent (for example, water) and then processing the metal powder to remove any surface contamination brought about by exposure to the solvent.

The metal produced by this methodology is also well suited to the formation of porous structures, in which the salt-coated metal particles are pressed together until the metal particles make physical contact with each other. The material can then be sintered and subsequently washed, to produce a porous object.

The metal produced by this methodology is also well suited to the formation of metal coatings and sheets. The salt-coated particles can be applied to a substrate, and then the salt coating can be removed to leave a coating of metal powder (which can be sintered to form a sheet or coating), or a coating of metal if the salt removal is accomplished at high enough temperatures to sinter the metal within the salt coating.

The metal produced by this methodology is also well suited to the formation of metal parts, components and objects, by pressing and sintering the metal powder to the desired final product shape, using the well-known techniques of powder metallurgy.

The salt coating of the metal particles can be removed by washing in a suitable solvent. Solvents include water (although this may oxidize the surface of the metal powder), ammonia, and other polar solvents.

The salt coating can also be removed by heating the metal particles to above the boiling point of the salt (a process that can be accelerated by application of a vacuum) and also by applying pressure to the metal to squeeze off the salt.

The precise choice of method(s) to remove the salt depends on the choice of end product and desired metallic purity, and will be apparent to those skilled in the art.

Binders can be added to the metal powder to enhance processing characteristics, for example to improve the ability to cast thick films of the metal. The binder should be chosen such that it can be removed from the metal by heating or other means in such a way as to avoid oxidation of the metal surface.

Finally, all the processes described herein can be accomplished using a gas phase reductant in place of the preferred liquid phase reductant.

Depending on the commercial application, the reaction product can then be processed together with its salt coating, or can be treated to remove the salt coating prior to use in applications. There are many commercial applications of this technology, illustrated by the following representative but non-exhaustive examples:

EXAMPLE 1

Aluminum chloride is heated in a reactor vessel, under argon and at 5 atmospheres pressure, to melt the aluminum chloride into liquid state. Sodium metal is injected in liquid form into the liquid aluminum. Aluminum chloride evaporation helps maintain the reaction temperature by removing the heat of reaction, and the evaporated aluminum chloride is captured for recycling.

The aluminum metal particles thus produced are, coated in sodium chloride and have an open aggregate structure.

The aluminum powder is then removed from the reactor without allowing air to contact the powder. The salt coating provides an air barrier but the process should be handled carefully to maintain an inert atmosphere.

Next, the metal particles can be pressed into an anode, with sufficient pressure to cause metal-to-metal contact without collapsing the porous structure of the aluminum powder. The pressed powder is then sintered to fuse the metal into a single porous element, and the salt is then washed off in water to remove the salt and simultaneously passivate the surface of the aluminum porous element. The aluminum element thus produced can be used for example as the anode for a capacitor.

EXAMPLE 2

Molten NaK (potassium-sodium alloy) is injected into a vessel containing molten tantalum chloride to produce tantalum particles with a coating of sodium chloride. Excess tantalum chloride will boil and help carry away the heat of reaction, and by maintaining the reactor vessel at a suitable temperature can be made to condense within the vessel and return as a liquid to the reaction zone. The reaction is run until the majority of the tantalum pentachloride has been consumed, at which point the injection of NaK is halted and excess unreacted tantalum chloride is removed by sublimation and recovered for re-use.

The tantalum powder so produced is then either (a) passivated by the controlled introduction of air into the reactor vessel or (b) removed to a second vessel and passivated there by the controlled introduction of air. In either case, the tantalum powder can undergo some processing, for example heat treatment to reduce surface area, prior to passivation of the powder.

Once passivated, the tantalum powder is washed to remove excess salt and is then further processed into a tantalum anode, using techniques well known to those skilled in the art of tantalum anode production.

EXAMPLE 3

Molten sodium is injected into a stream of titanium chloride, reacting to produce titanium metal powders coated in sodium chloride. Heating to above the boiling point of titanium chloride removes the excess titanium chloride and allows the salt-coated titanium particles to be recovered. The titanium powder so produced is then either (a) passivated by the controlled introduction of air into the reactor vessel or by washing in water to passivate and dissolve the salt coating, or (b) removed to a second vessel and passivated there by the controlled introduction of air or by washing in water to passivate and dissolve the salt coating. In either case, the tantalum powder can undergo some processing, for example heat treatment to reduce surface area, prior to passivation of the powder.

The above examples are intended only to be illustrative of the wide range of metals and alloys and their applications, made accessible by the invention described herein.

What is claimed is:

1. A process to reduce mixtures of at least one metal halide by molten metal reduction of the liquid phase of a metal halide in an alkali or alkaline earth metal to form a reaction product comprising at least one metal mixture and a halide salt coating, wherein the molten metal reductant is in stoichiometric excess to the metal halide, and wherein the reductant is consumed in the reaction and does not need to be removed at the end of the reaction;

wherein the at least one metal halide mixture comprises a mixture of metal chlorides and the molten metal reductant comprises metallic sodium; and wherein the reaction temperature is selected from the group consisting of:
  (a) a reaction temperature of 275° C., wherein the particle size of the reaction product primary particle size ranges from 10 to 50 nm, and wherein the aggregate particle sizes range from 0.2 to 1 micron;
  (b) a reaction temperature of 550° C. and the particle size of the reaction product primary particle size ranges from 20 to 100 nm, and wherein the aggregate particle sizes range from 0.4 to 5 microns; and
  (c) a reaction temperature is 775° C. and the particle size of the reaction product primary particle size ranges from 50 to 500 nm, and wherein the aggregate particle sizes range from 0.6 to 25 microns.

2. The process of claim 1 wherein the sodium in the molten metal reductant is obtained from NaK.

3. The process of claim 2 wherein the reaction temperature is 275° C. and the particle size of the reaction product primary particles ranges from 10 to 50 nm.

4. The process of claim 2 wherein the reaction temperature is 550° C. and the particle size of the reaction product primary particles range from 20 to 100 nm.

5. The process of claim 2 wherein the reaction temperature is 775° C. and the particle size of the reaction product primary particles range from 50 to 500 nm.

* * * * *